United States Patent
Dekel et al.

(10) Patent No.: US 8,634,671 B2
(45) Date of Patent: Jan. 21, 2014

(54) METHODS AND APPARATUS TO PERFORM MULTI-FOCAL PLANE IMAGE ACQUISITION AND COMPRESSION

(75) Inventors: Shai Dekel, Ramat-Hasharon (IL); Anthony Melanson, Essex Junction, VT (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 13/618,713

(22) Filed: Sep. 14, 2012

(65) Prior Publication Data

US 2013/0038750 A1 Feb. 14, 2013

Related U.S. Application Data

(63) Continuation of application No. 12/410,146, filed on Mar. 24, 2009, now Pat. No. 8,300,965.

(51) Int. Cl.
*G06K 9/40* (2006.01)
*G02B 15/14* (2006.01)
*G02B 7/02* (2006.01)

(52) U.S. Cl.
USPC ............ 382/240; 382/274; 359/676; 359/823

(58) Field of Classification Search
USPC .......... 382/240, 274, 254, 255, 237; 359/642, 359/676, 683, 686, 687, 432, 672, 694, 754, 359/823; 396/89; 250/200, 201.1, 204; 348/222.1, E5.024
See application file for complete search history.

(56) References Cited

U.S. PATENT DOCUMENTS

| | | | | |
|---|---|---|---|---|
| 5,027,147 A | * | 6/1991 | Kaneda | 396/81 |
| 5,798,872 A | * | 8/1998 | Uzawa | 359/686 |
| 6,525,303 B1 | * | 2/2003 | Gladnick | 250/208.1 |
| 7,133,543 B2 | | 11/2006 | Verwoerd et al. | |
| 7,139,415 B2 | * | 11/2006 | Finkbeiner | 382/128 |
| 7,376,279 B2 | | 5/2008 | Dekel et al. | |
| 7,609,958 B2 | * | 10/2009 | Border et al. | 396/89 |
| 7,630,148 B1 | * | 12/2009 | Yang et al. | 359/740 |
| 7,693,409 B2 | * | 4/2010 | Morimoto | 396/85 |
| 7,876,948 B2 | * | 1/2011 | Wetzel et al. | 382/133 |
| 2007/0069106 A1 | | 3/2007 | Krief et al. | |
| 2010/0246988 A1 | | 9/2010 | Dekel et al. | |

OTHER PUBLICATIONS

"JPEG Homepage," Author Unknown, http://www.jpeg.org/jpeg/index.html, Copyright 2007; 2 pages.

(Continued)

*Primary Examiner* — Sheela Chawan
(74) *Attorney, Agent, or Firm* — Hanley, Flight & Zimmerman, LLC

(57) ABSTRACT

Example methods and apparatus to perform multi-focal plane image acquisition and compression are disclosed. A disclosed example method includes capturing a first image of a portion of an object at a first focal plane and at a first resolution, computing a contrast metric for the captured first image, comparing the contrast metric to a threshold to determine whether to capture a second image of the portion of the object at the first focal plane and at a second resolution, wherein the second resolution is different from the first resolution, capturing the second image of the portion of the object at the first focal plane and at the second resolution, and storing a first representation of the second image in a file, the file containing a second representation of the portion of the object at a second focal plane, wherein the second representation is at the first resolution.

20 Claims, 7 Drawing Sheets

(56) References Cited

OTHER PUBLICATIONS

"The JPEG committee home page," Author Unknown, http://www.jpeg.org/index.html?langsel=en, Copyright 2007, 1 page.

"JPEG 2000, Our New Standard," Author Unknown, http://www.jpeg.org/jpeg2000/index.html, Copyright 2007, 1 page.

United States Patent and Trademark Office, "Nottice of Allowance," issued in connection with U.S. Appl. No. 12/410,146, mailed on Jun. 14, 2012, 34 pages.

* cited by examiner

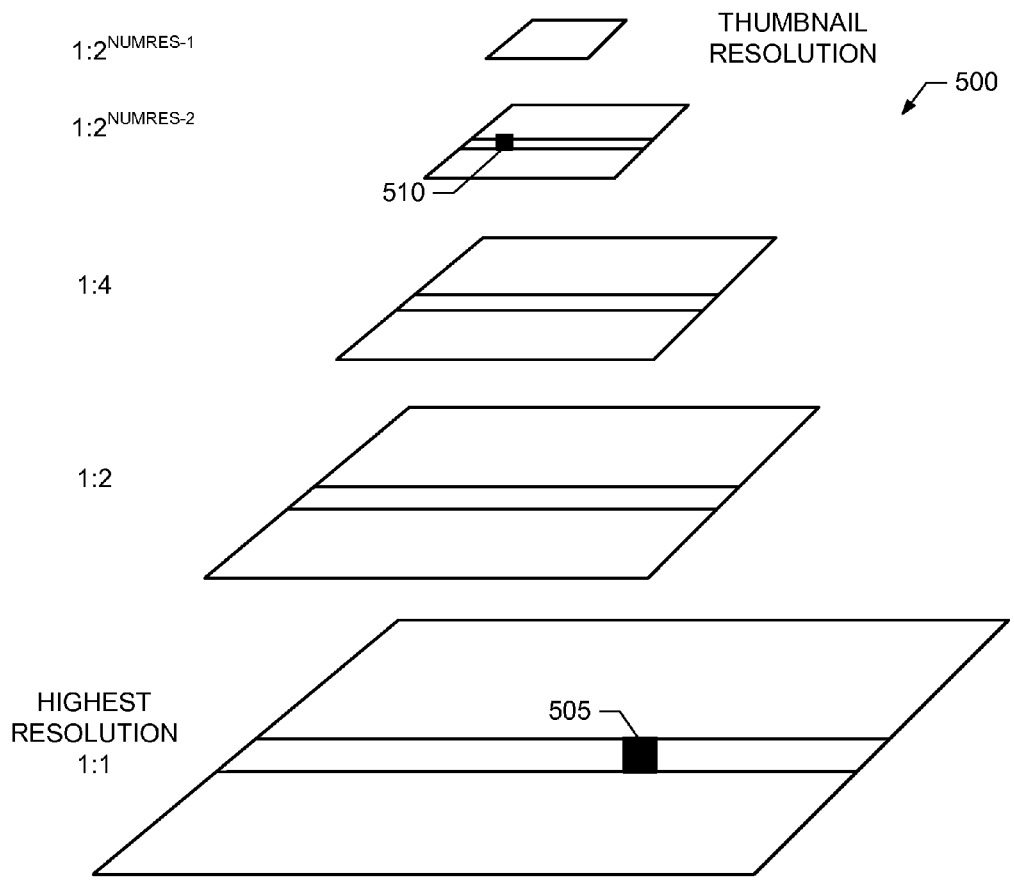

METHODS AND APPARATUS TO PERFORM MULTI-FOCAL PLANE IMAGE ACQUISITION AND COMPRESSION

RELATED APPLICATION

This patent arises from a continuation of U.S. application Ser. No. 12/410,146, filed Mar. 24, 2009, now U.S. Pat. No. 8,300,965, which is hereby incorporated herein in its entirety.

FIELD OF THE DISCLOSURE

This disclosure relates generally to image acquisition and, more particularly, to methods and apparatus to perform multi-focal plane image acquisition and compression.

BACKGROUND

In the emerging field of digital pathology, images of tissue sample slides are digitally scanned and/or imaged, and saved as digital images. Each such image may consume as much as 10-to-25 Gigabytes (GB) of storage. The tissue sample, which is placed on the slide, may have a thickness of a few microns to a few millimeters. In some examples, the slides are scanned into a single two-dimensional (2D) image, where an autofocus algorithm determines and/or selects a focal plane for each area, region and/or portion of the image. In other examples, the slide is completely imaged and/or captured for and/or on each of a number of focal planes. Accordingly, a file representing the slide contains a plurality of 2D images for respective ones of a plurality of focal planes. The various 2D focal plane images can then be interpolated to allow a pathologist to interactively review any portion(s) of the digital slide at different focal planes.

BRIEF DESCRIPTION OF THE INVENTION

Example methods and apparatus to perform multi-focal plane image acquisition and compression are disclosed. In general, the examples disclosed herein adaptively scan and/or image a slide to substantially reduce storage requirements while maintaining sufficient resolution and a sufficient number of focal planes to permit analysis of the slide by a pathologist. When a slide is scanned at a particular focal plane, different regions, areas and/or portions of the slide may be adaptively captured at different resolutions depending on whether particular region exhibits one or more characteristics representative of potential and/or anticipated interest by a pathologist. Additional savings may be realized by the application of multi-scale wavelet transforms.

A disclosed example method includes capturing a first image of a portion of an object at a first focal plane and at a first resolution, computing a contrast metric for the captured first image, comparing the contrast metric to a threshold to determine whether to capture a second image of the portion of the object at the first focal plane and at a second resolution, wherein the second resolution is different from the first resolution, capturing the second image of the portion of the object at the first focal plane and at the second resolution, and storing a first representation of the second image in a file, the file containing a second representation of the portion of the object at a second focal plane, wherein the second representation is at the first resolution.

A disclosed example apparatus includes a contrast detector to compute a contrast metric for a first image of an object at a first focal plane and at a first resolution, an acquisition controller to compare the contrast metric to a threshold to determine whether to capture a second image of the object at the first focal plane and at a second resolution, wherein the second resolution is different from the first resolution, an image acquirer selectively operable to capture the first and second images, and an image compression module to store a first representation of the object at the first focal in a file, the file containing a second representation of the object at a second focal plane, wherein the second representation corresponds to a different resolution than the first representation.

BRIEF DESCRIPTION OF THE DRAWINGS

FIG. 5 illustrates an example multi-resolution representation of an image.

FIG. 6 illustrates an example data structure that may be used to implement the example compressed image of FIG. 1.

DETAILED DESCRIPTION

Some of the existing techniques that collapse multiple focal planes into a single 2D image do not permit a pathologist to manually control the focal plane for different regions of interest. Accordingly, such files are generally unacceptable to pathologists. While other existing techniques overcome this deficiency by capturing multiple complete 2D images at multiple focal planes, they require the storage of large amounts of data. For example, a file containing ten 2D images for ten different focal planes might consume 100-to-250 GB of storage. If a patient has 10-to-30 such slides, as much as 7.5 Terabytes (TB) of storage may be required.

Example methods and apparatus to perform multi-focal plane image acquisition and compression are disclosed that overcome at least these deficiencies. In general, the examples disclosed herein adaptively scan and/or image a slide to substantially reduce the acquisition time and/or the amount of storage capacity required to represent the slide with sufficient resolution and at a sufficient number of focal planes to permit analysis of the slide via the digitally captured images by a pathologist. For each region, area and/or portion of a slide at a particular focal plane, the examples disclosed herein adaptively determine at what resolution the portion of the slide is to be captured. A particular region exhibiting one or more characteristics representative of potential and/or anticipated interest by a pathologist are scanned at high(er) resolution, while other regions are scanned at a low(er) resolution. Thus, the image of a slide at a particular focal plane has regions that are scanned, captured and/or imaged at different resolutions. Additional savings may be realized by the application of multi-scale wavelet transforms that permit compression of the different resolution portions. Using adaptive scanning and wavelet transforms the amount of data needed to represent a particular focal plane may be reduced by as much as a factor of ten. Moreover, because some focal planes may contain no regions of interest, they may consume even less storage capacity.

Figure 1:
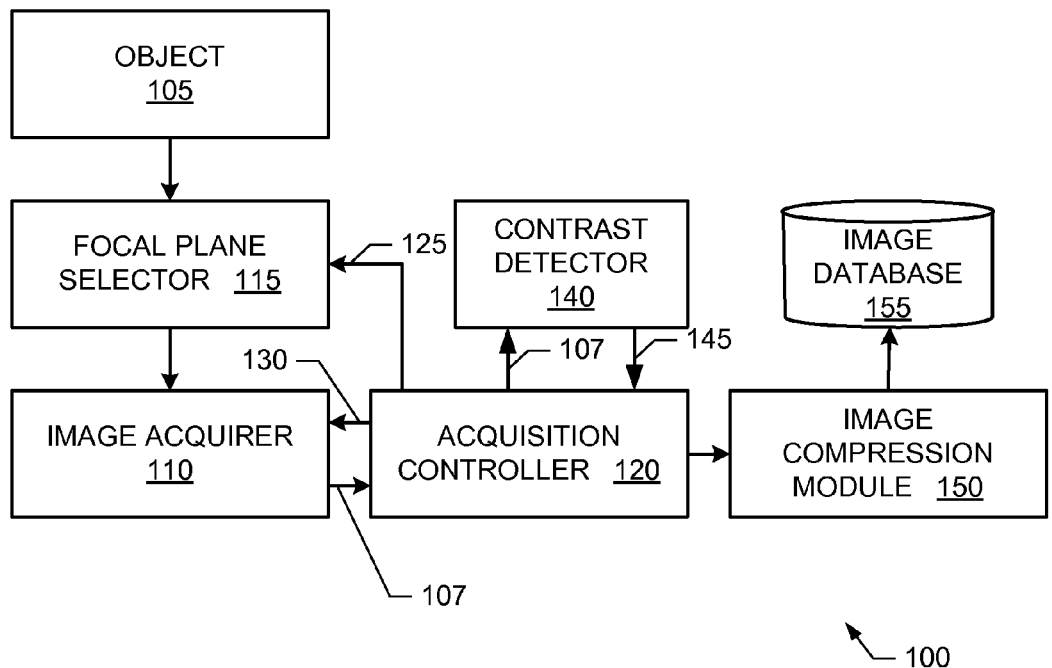
FIG. 1 is a schematic illustration of an example adaptive multi-focal plane image acquisition and compression apparatus.

FIG. 1 is a schematic illustration of an example adaptive multi-focal plane image acquisition and compression apparatus 100 constructed in accordance with the teachings of this disclosure. The example adaptive multi-focal plane image acquisition and compression apparatus 100 of FIG. 1 captures and/or acquires a multi-focal plane, multi-resolution image and/or representation of an object 105. While the example object 105 of FIG. 1 includes a tissue sample on a slide, an image and/or representation of any number and/or type(s) of medical and/or non-medical objects 105 may be captured and/or acquired by the example apparatus 100.

To acquire, capture and/or otherwise obtain an image 107 of the object 105, the example adaptive multi-focal plane image acquisition and compression apparatus 100 of FIG. 1 includes an image acquirer 110 and a focal plane selector 115. The example image acquirer 110 of FIG. 1 may be any number and/or type(s) of image capture device(s) capable to acquire, capture and/or otherwise obtain a digital image 107 that represents all or a portion of the object 105. Example image acquirers 110 include, but are not limited to, a digital camera and/or an image sensor. The example image acquirer 110 is selectively configurable and/or operable to capture images 107 at different resolutions. The example focal plane selector 115 of FIG. 1 is selectively configurable, controllable and/or operable to adjust the focus of the image acquirer 110 at a particular focal plane. An example focal plane selector 115 includes, but is not limited to, a variable focus lens, and/or any number and/or type(s) of method(s) and/or algorithm(s) that may be applied to a captured image to adjust and/or control an effective focal plane of the captured image.

To control the acquisition and/or capture of images, the example adaptive multi-focal plane image acquisition and compression apparatus 100 of FIG. 1 includes an acquisition controller 120. The example acquisition controller 120 of FIG. 1 controls, configures and/or operates the focal plane selector 115 via control signals and/or paths 125 to focus the image acquirer 110 at a particular focal plane. The example acquisition controller 120 controls, configures and/or operates the image acquirer 110 via control signals and/or paths 130 to acquire, capture and/or otherwise obtain an image 107 at a selected resolution and at a particular focal plane configured via the focal plane selector 115.

Figure 2:
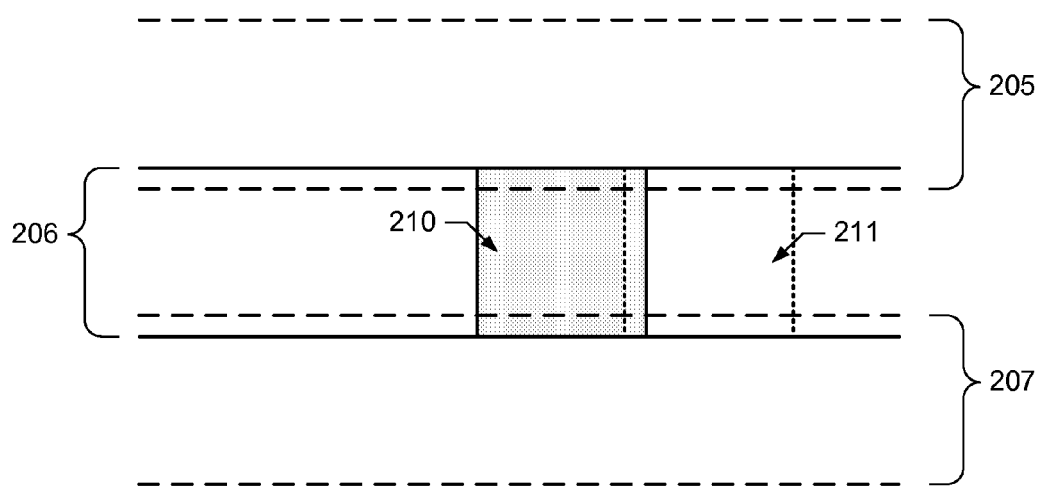
FIG. 2 illustrates an example method of imaging based on overlapping strips and tiles.

As shown in FIG. 2, images 107 of the object 105 are captured for portions, regions, areas and/or tiles 210 and 211 of the object 105. That is, a complete two-dimensional (2D) image 107 of the object 105 at a particular focal plane includes a plurality of images 107 for respective ones of a plurality of tiles 210 and 211. As shown in FIG. 2, the tiles 210 and 211 are arranged in strips 205-207 that traverse the width (or length) of the object 105. Each strip 205-207 is then divided into the regions, portions and/or tiles 210 and 211. As described below, the example acquisition controller 120 adaptively selects and/or determines the resolution at which the image 107 of a particular tile 210, 211 is captured. To facilitate compression, reconstruction and/or display of the entire 2D image from the images 107 of the constituent tiles 210 and 211, which may have been captured at different resolutions, the strips 205-207 partially overlap with adjacent strips 205-207, and the tiles 210 and 211 overlaps with adjacent tiles 210 and 211.

A set of 2D images of the object 105 may be captured based on any number and/or type(s) of sequence(s) and/or order(s). For example, starting with a first focal plane, images 107 of the tiles 210 and 211 of the strip 205 may be captured. When the strip 205 has been imaged, images 107 of the tiles 210 and 211 of the next strip 206 may be captured. The process continues until the entire first focal plane has been imaged, and then may be repeated for any additional focal planes. Additionally or alternatively, for each tile 210, 211 of each strip 205-207 images 107 may be captured for each focal plane before changing the tile 210, 211 and/or strip 205-207.

Returning to FIG. 1, to determine at what resolution an image 107 is to be captured, the example adaptive multi-focal plane image acquisition and compression apparatus 100 of FIG. 1 includes a contrast detector 140. For a presently considered image 107, the example contrast detector 140 of FIG. 1 computes a value and/or metric 145 representative of whether the presently considered tile 210, 211 at the presently considered focal plane may be considered of interest by a pathologist. An example representative value and/or metric 145 is an estimate of the contrast of the image 107 of the presently considered tile 210, 211. The estimated contrasted may be computed using any number and/or type(s) of method(s), algorithm(s) and/or logic. For example, a contrast metric 145 may be computed as the variance of the intensity Y, of the pixels of a captured image 107, which represents a measure of the local image contrast over the image 107. In general, high contrast values correspond to the presence of strong edges in an image and, thus, to potential regions of interest for a pathologist. For a color image 107, the intensity value Y, of a single RGB pixel i can be estimated as $Y_i=0.299*R_i+0.587*G_i+0.114*B$. Assuming that E(Y) is the average of the intensity values $Y_i$ over a presently considered tile 210, 211, the variance of the pixels of the image 107 (i.e., the contrast metric 145) can be computed using the following mathematical expression:

$$\sigma^2 = \frac{1}{N}\sum_{i=1}^{N}(Y_i - E(Y))^2, \qquad \text{EQN (1)}$$

assuming the image has N pixels.

Another example contrast metric 145, which is an estimate of local visual activity, is the Laplacian-Gaussian operator. The Laplacian-Gaussian operator includes a Gaussian smoothing filter followed by a Laplacian differentiation filter. In general, large output values of the Laplacian-Gaussian operator correspond to the presence of strong edges in an image and, thus, to potential regions of interest for a pathologist. Assuming $GL(Y_i)$ is the output of a Laplacian-Gaussian filter applied to the intensity value $Y_i$, a contrast metric 145 for the image can be expressed as:

$$\frac{1}{N}\sum_{i=1}^{N}GL(Y_i). \qquad \text{EQN (2)}$$

For a presently considered tile 210, 211 and focal plane, the example acquisition controller 120 of FIG. 1 controls the example image acquirer 110 to capture a first image 107 of the presently considered tile 210, 211 at a first or low resolution. The acquisition controller 120 directs the example contrast detector 140 to compute a contrast metric 145 for the first or low resolution image 107. The example acquisition controller 120 compares the contrast metric 145 to a threshold to determine whether to capture a second or higher resolution image 107 of the presently considered tile 210, 211 at the focal plane. When the contrast metric 145 is greater than the threshold, the acquisition controller 120 directs the image acquirer 110 to capture a second image 107 of the presently considered tile 210, 211 at a second or high(er) resolution.

In some examples, the second or high(er) resolution is the highest resolution of the image acquirer 110 and the first or low(er) resolution is a resolution corresponding to a thumbnail resolution. Additionally or alternatively, the example acquisition controller 120 directs the image acquirer 110 to take successive images 107 of the presently considered tile 210, 211 at increasing resolutions until the contrast metric 145 computed by the contrast detector 145 for each successive image 107 no longer exceeds the threshold. In some example, the contrast metric 145 is compared to different thresholds depending on the resolution of the image 107.

Figure 3:
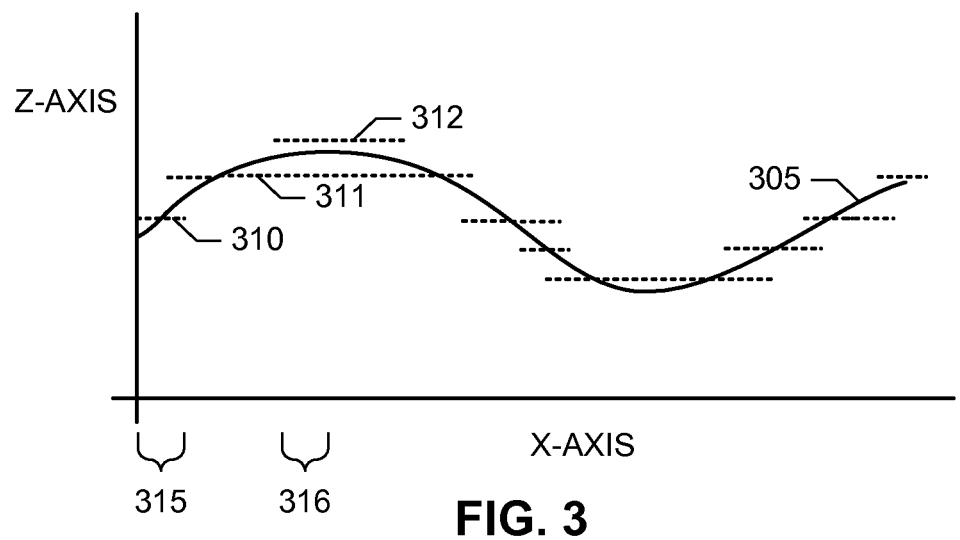
FIGS. 3 and 4 illustrate example tissue samples having focal planes of interest that vary along an axis of an object.
Figure 4:
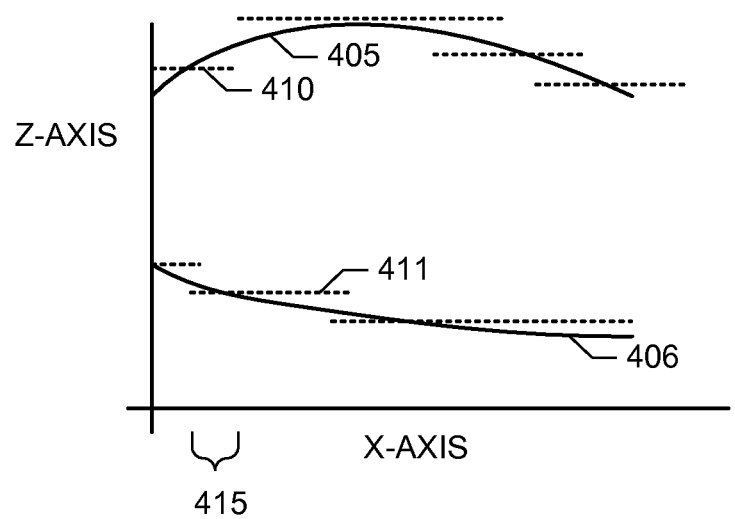

As shown in FIGS. 3 and 4, the resolution at which images 107 for different tiles 210 and 211 and different focal planes may vary through the object 105. FIG. 3 depicts an object 105 having a feature 305 that occurs at different focal planes (three of which are depicted at reference numerals 310, 311 and 312) within the object 105. For example, at a first tile 315 images 107 of the object 205 are captured at a high(er) resolution at a focal plane 310 and at a low(er) resolution at a focal plane 311. In some instances, a tile 316 may be captured with a high(er) resolution at two adjacent focal planes 311 and 312 when the feature 305 occurs between and/or substantially near two focal planes 311 and 312 within the tile 316.

FIG. 4 depicts an object 105 having two features 405 and 406 that are at potentially different focal planes (two of which are depicted at reference numerals 410 and 411) within the object 105. For example, a tissue sample having more than one layer of cell structures may have more than one feature of interest. Accordingly, a tile 415 may be captured with a high or higher resolution at two adjacent and/or non-adjacent focal planes 410 and 411. Based on at least FIGS. 3 and 4, it should be clear that any tile 210, 211 might be captured at a higher or high resolution for any number of adjacent and/or non-adjacent focal planes depending on the feature(s) present in the object 105 within the tile 210, 211.

FIG. 5 illustrates an example logical multi-scale depiction 500 of the multi-resolution 2D image captured for a particular focal plane. As shown in FIG. 5, the 2D image comprises images 107 of different tiles 210 and 211 captured at different resolutions. For example, an image 107 captured for a tile 505 was captured at the highest resolution of the image acquirer 110, while an image 107 capture for another tile 510 was captured at a lower resolution. Thus, the resolution at which an image 107 is captured determines where in the multi-scale representation 500 each captured image 107 and/or data representative of the captured image 107 logically corresponds. In the illustrated example of FIG. 5, adjacent resolutions differ by a factor of two.

A representation of any portion of a captured multi-resolution 2D image for any particular resolution can be generated by appropriate interpolation and/or decimation of the captured tile images 107. For example, a 1:4 scale image of the 2D image in the vicinity of the tile 505 can be generated by decimating the image 107 corresponding to the tile 505 by a factor of four.

While the example multi-scale depiction 500 of FIG. 5 may be used to actually store a representation of a multi-scale 2D image, an example data structure 600 that may be used to more effectively store a multi-scale 2D image is described below in connection with FIG. 6. In general, the example data structure 600 of FIG. 6 is formed by "flattening" the example depiction 500 and removing portions that do not contain image data. It should be understood that the example depiction 500 of FIG. 5 and the example data structure 600 of FIG. 6 may represent essentially equivalent representations of a multi-scale 2D image.

Returning to FIG. 1, to compress the images 107 captured by the example image acquirer 110 and the example acquisition controller 120, the example adaptive multi-focal plane image acquisition and compression apparatus 100 of FIG. 1 includes a compression module 150. For the highest resolution image 107 captured for a particular tile 210, 211, the example image compression module 150 applies a wavelet transform to generate one or more wavelet coefficients that represent that image 107. The example compression module 150 stores the computed wavelet coefficients in an image database 155. The computed wavelet coefficients can be stored in the image database 155 using the example structure(s) of FIGS. 5 and/or 6. The example image database 155 of FIG. 1 may be implemented using any number and/or type(s) of memory(-ies), memory device(s) and/or storage device(s) such as a hard disk drive, a compact disc (CD), a digital versatile disc (DVD), a floppy drive, etc. The high(est) frequency wavelet coefficients are associated with the presently considered tile 210, 211 at the highest resolution at which the tile 210, 211 was imaged, while the low frequency wavelet coefficients are associated with the presently considered tile 210, 211 at the next lower resolution, as depicted in FIG. 7.

Figure 7:
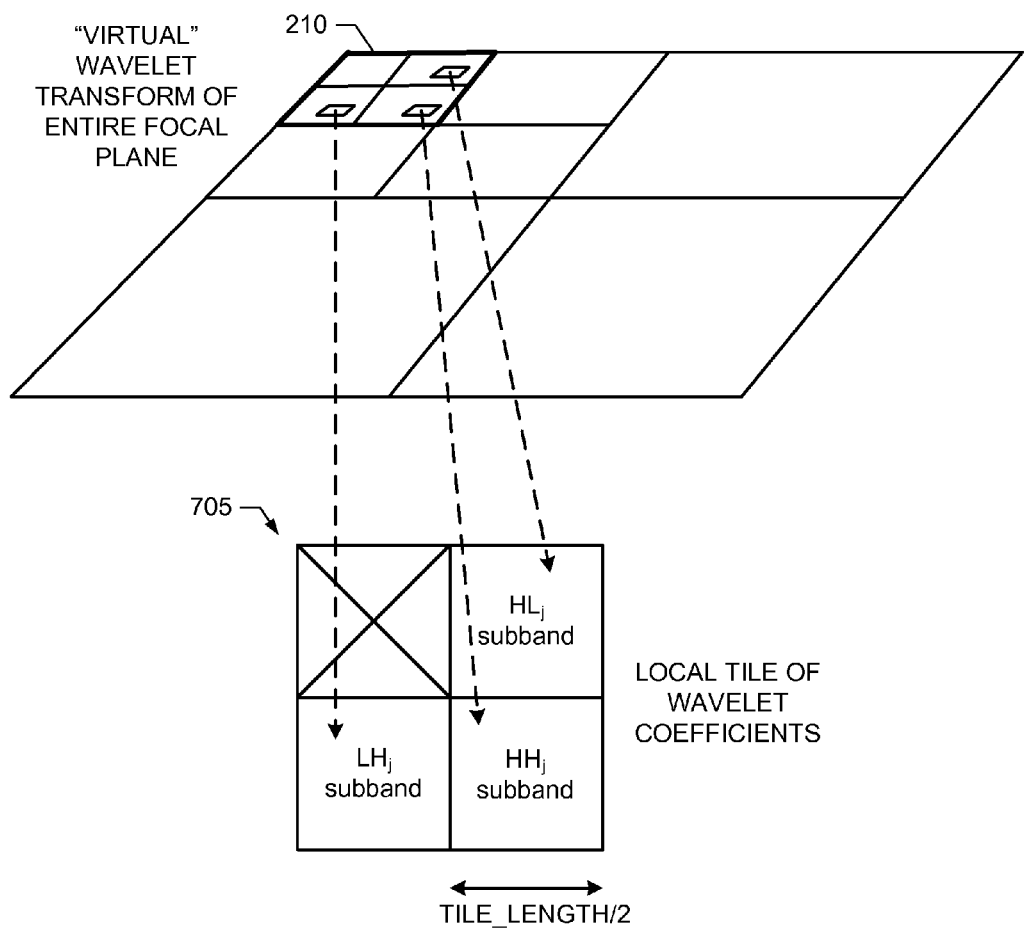
FIG. 7 illustrates an example virtual multi-resolution wavelet transform representation of an object.

FIG. 7 depicts a "virtual" wavelet transform that represents the entire 2D image associated with a particular focal plane. As shown in FIG. 7, each tile 210 of the focal plane has associated wavelet coefficients 705 computed based on the image 107 captured for that tile 210 at the resolution selected by the example acquisition controller 120. The wavelet coefficients 705 can be regarded as multi-scale edge detectors, where the absolute value of a wavelet coefficient 705 corresponds to the local strength of that edge, that is, how likely the edge and, thus, the tile 210 may be of interest to a pathologist. In the illustrated example of FIG. 7, low-frequency edges are depicted in the upper left-hand corner of the wavelet coefficients 705, with progressively higher-frequency edges occur downward and/or rightward in the wavelet coefficients 705.

Taken collectively, the wavelet coefficients 705 for all of the tiles 210, 211 of the focal plane can be used to generate a representation of the image 105 at that focal plane and at any selected resolution. Example methods and apparatus that may be used to display, represent, transmit and/or store a set of 2D multi-resolution images as a three-dimensional (3D) image are described in U.S. Pat. No. 7,376,279, entitled "Three-dimensional Image Streaming System and Method for Medical Images," issued May 20, 2008, and which is hereby incorporated by reference in its entirety.

Returning to FIG. 1, to further reduce the amount of data needed to store the representation 155 of the object 105, the example image compression module 140 of FIG. 1 may further process the computed wavelet coefficients to reduce redundancy and/or to reduce the amount of data needed to store and/or represent the wavelet coefficients. Using any number and/or type(s) of algorithm(s), method(s) and/or logic, the image compression module 140 may quantize and/or entropy encode the computed wavelet coefficients according to their tree-structure using, for example, a so-called "zero-tree" compression algorithm. In some examples, local groups of wavelet coefficients at given tiles and/or focal planes are compressed into different data blocks. By grouping wavelet coefficients in different data blocks, only a portion of the compressed image 155 needs to be extracted to begin reconstructing an image of the original object 105. Such groupings of wavelet coefficients facilitate the rendering an image of only a particular region-of-interest of the object 105 at a particular focal plane and resolution, and/or facilitate the progressive reconstruction of an image of the object 105.

While the examples described herein utilize wavelet coefficients to represent a compressed version of the captured images 107 of the object 105, any number and/or type(s) of additional and/or alternative compression method(s), technique(s), and/or algorithm(s) may be applied. For example, each of the captured images 107 could be interpolated, as necessary, to a common resolution. The interpolated images 107 could then be compressed in accordance with, for example, the joint photographic experts group (JPEG) and/or JPEG2000 standards.

While an example adaptive multi-focal plane image acquisition and compression apparatus 100 has been illustrated in FIG. 1, one or more of the interfaces, data structures, elements, processes and/or devices illustrated in FIG. 1 may be combined, divided, re-arranged, omitted, eliminated and/or implemented in any other way. Further, the example image acquirer 110, the example focal plane selector 115, the example acquisition controller 120, the example contrast detector 140, the example image compression module 150 and/or, more generally, the example adaptive multi-focal plane image acquisition and compression apparatus 100 of FIG. 1 may be implemented by hardware, software, firmware and/or any combination of hardware, software and/or firmware. Thus, for example, any of the example image acquirer 110, the example focal plane selector 115, the example acquisition controller 120, the example contrast detector 140, the example image compression module 150 and/or, more generally, the example adaptive multi-focal plane image acquisition and compression apparatus 100 may be implemented by one or more circuit(s), programmable processor(s), application-specific integrated circuit(s) (ASIC(s)), programmable logic device(s) (PLD(s)), field-programmable logic device(s) (FPLD(s)), and/or field-programmable gate array(s) (FPGA(s)), etc. When any of the appended claims are read to cover a purely software and/or firmware implementation, at least one of the example image acquirer 110, the example focal plane selector 115, the example acquisition controller 120, the example contrast detector 140, the example image compression module 150 and/or, more generally, the example adaptive multi-focal plane image acquisition and compression apparatus 100 are hereby expressly defined to include a tangible computer-readable medium such as a memory, a DVD, a CD, a hard disk, a floppy disk, etc. storing the firmware and/or software. Further still, the example adaptive multi-focal plane image acquisition and compression apparatus 100 may include interfaces, data structures, elements, processes and/or devices instead of, or in addition to, those illustrated in FIG. 1 and/or may include more than one of any or all of the illustrated interfaces, data structures, elements, processes and/or devices.

FIG. 6 illustrates an example data structure 600 that may be used to implement the example image database 155 of FIG. 1. The example data structure 600 of FIG. 6 includes a plurality of entries 605 for respective combinations of tiles 210, 211 and focal planes. To identify a tile 210, 211, each of the example entries 605 of FIG. 6 includes a tile field 610. Each of the example tile fields 610 of FIG. 6 includes one or more numbers and/or identifiers that represent a particular tile 210, 211 at a particular focal plane 615 and at a particular resolution 620.

To identify a focal plane, each of the example entries 605 of FIG. 6 includes a focal plane field 615. Each of the example focal plane fields 615 of FIG. 6 contains a number and/or identifier that represents a focal plane at which an image 107 was acquired.

To identify an image resolution, each of the example entries 605 of FIG. 6 includes a resolution field 620. Each of the example resolution fields 620 of FIG. 6 includes a number and/or identifier that represents the resolution at which an image 107 of the tile 610 was captured.

To identify a position of the tile 610, each of the example entries 605 of FIG. 6 includes a position field 625. Each of the example position fields 625 of FIG. 6 includes two values and/or indices that respectively represent an x-coordinate and a y-coordinate.

To specify a quality layer, each of the example entries 605 of FIG. 6 includes a quality field 630. Each of the example quality fields 630 of FIG. 6 includes a value that may be used to facilitate, for example, progressive rendering.

To store wavelet coefficients, each of the example entries 605 of FIG. 6 includes a wavelet coefficients field 635. Each of the example wavelet coefficients field 635 of FIG. 6 stores one or more wavelet coefficients computed for the tile 610. In some examples, 3D wavelets may be used to exploit the correlation between focal planes and, thus, the wavelets 635 represent differences between focal planes. In such examples, the value contained in the plane field 615 does not correspond to a specific focal plane, but rather with a difference of focal planes for the tile 610.

While an example data structure 600 that may be used to implement the example image database 155 has been illustrated in FIG. 6, one or more of the entries and/or fields may be combined, divided, re-arranged, omitted, eliminated and/or implemented in any other way. For example, the quality field 630 may be omitted in some examples. Moreover, the example data structure 600 of FIG. 6 may include fields instead of, or in addition to, those illustrated in FIG. 6 and/or may include more than one of any or all of the illustrated fields.

Figure 8:
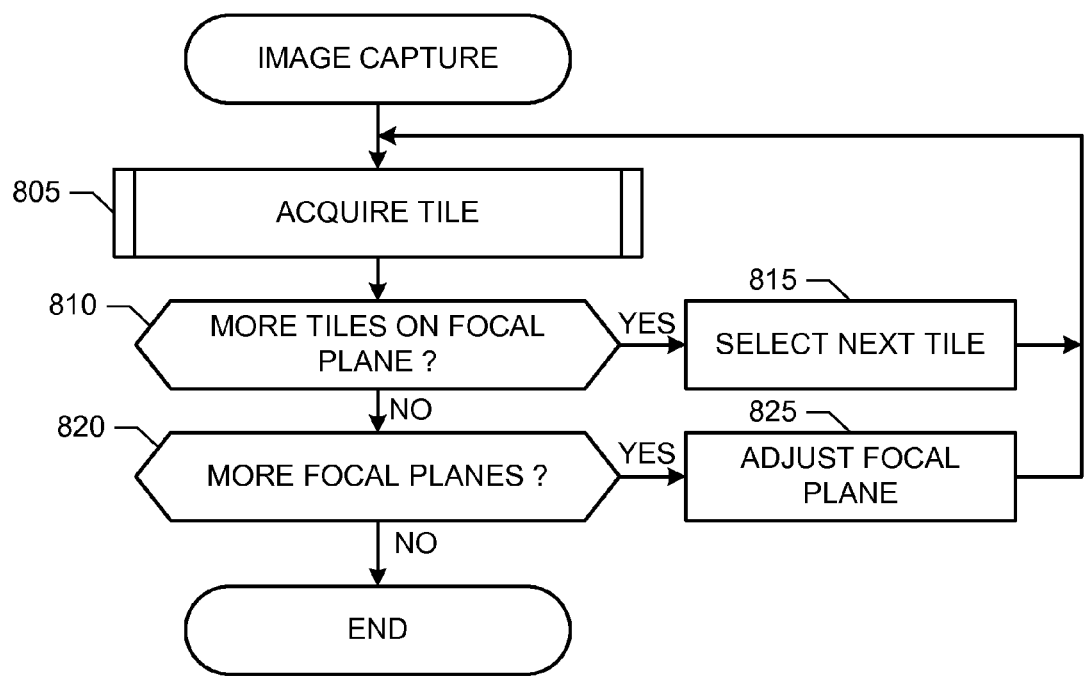
FIGS. 8 and 9 are flowcharts representative of example processes that may be carried out to implement the example adaptive multi-focal plane image acquisition and compression apparatus of FIG. 1.
Figure 9:
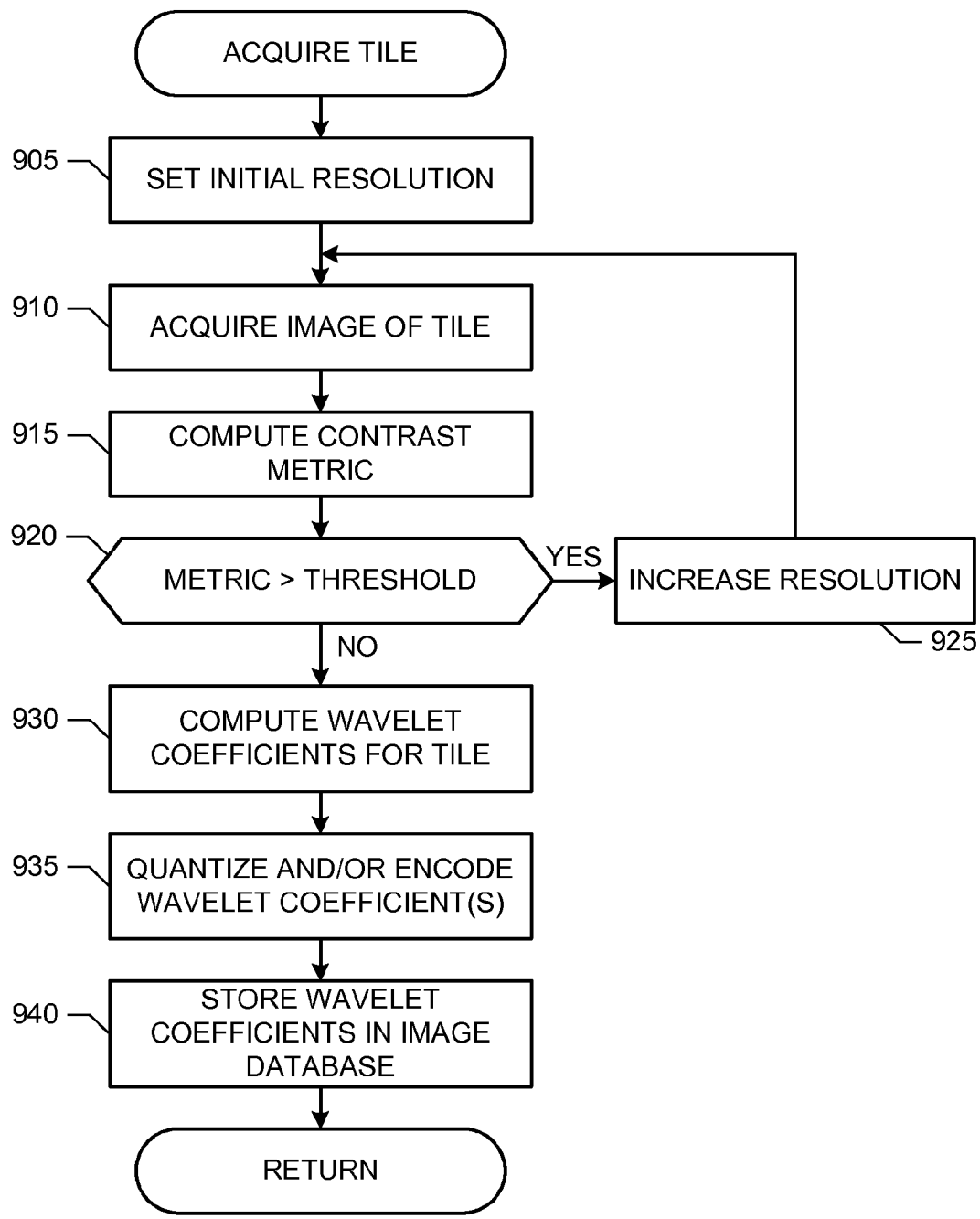

FIGS. 8 and 9 illustrate example processes that may be carried out to implement the example adaptive multi-focal plane image acquisition and compression apparatus 100 of FIG. 1. A processor, a controller and/or any other suitable processing device may be used and/or programmed to carry out the example processes of FIGS. 8 and/or 9. For example, the example processes of FIGS. 8 and/or 9 may be embodied in coded instructions stored on a tangible computer-readable medium such as a flash memory, a CD, a DVD, a floppy disk, a read-only memory (ROM), a random-access memory (RAM), a programmable ROM (PROM), an electronically-programmable ROM (EPROM), and/or an electronically-erasable PROM (EEPROM), an optical storage disk, an optical storage device, magnetic storage disk, a magnetic storage device, and/or any other medium which can be used to carry or store program code and/or instructions in the form of machine-readable instructions or data structures, and which can be accessed by a processor, a general purpose or special purpose computer or other machine with a processor (e.g., the example processor platform P100 discussed below in connection with FIG. 10). Combinations of the above are also included within the scope of computer-readable media. Machine-readable instructions comprise, for example, instructions and data that cause a processor, a general-purpose computer, special purpose computer, or a special-purpose processing machine to perform one or more particular processes. Alternatively, some or all of the example processes of FIGS. 8 and/or 9 may be implemented using any combination(s) of ASIC(s), PLD(s), FPLD(s), FPGA(s), discrete logic, hardware, firmware, etc. Also, some or all of the example processes of FIGS. 8 and/or 9 may be implemented manually or as any combination of any of the foregoing techniques, for example, any combination of firmware, software, discrete logic and/or hardware. Further, many other methods of implementing the example operations of FIGS. 8 and/or 9 may be employed. For example, the order of execution of the blocks may be changed, and/or one or more of the blocks described may be changed, eliminated, sub-divided, or combined. Additionally, any or all of the example processes of FIGS. 8 and/or 9 may be carried out sequentially and/or carried out in parallel by, for example, separate processing threads, processors, devices, discrete logic, circuits, etc.

The example process of FIG. 8 begins with adaptively acquiring an image 107 of presently considered tile 210, 211 at presently considered focal plane by, for example, carrying out the example process of FIG. 9 (block 805). If there are more tiles 210, 211 on the presently considered focal plane that have not been imaged (block 815), the next tile 210, 211 is selected (block 820), and control returns to block 805 to adaptive acquire an image for the selected next tile 210, 211.

If all the tiles 210, 211 of the presently considered focal plane have been imaged (block 810), and an additional focal plane is to be imaged (block 815), the acquisition controller 120 controls the example focal plane selector 115 to focus the example image acquirer 110 on a next focal plane (block 825), and controls returns to block 805 to adaptive image the selected next focal plane.

When all focal planes have been imaged (block 825), control exits from the example process of FIG. 8.

The example process of FIG. 9 begins with the example acquisition controller 120 selecting an initial resolution (block 905). The example image acquirer 110 captures an image 107 of the presently considered tile 210, 211 at the selected resolution (block 910). The example contrast detector 140 computes the contrast metric 145 for the captured image 107 by carrying out, for example, either of the example mathematical expressions of EQN (1) and EQN (2) (block 915).

The acquisition controller 120 compares the contrast metric 145 to a threshold to determine whether to capture a second image 107 of the presently considered tile 210, 211 (block 920). If the contrast metric 145 is greater than the threshold (block 920), the acquisition controller 120 changes the resolution of the image acquirer 110 (block 925), and control returns to block 910 to capture another image 107 of the presently considered tile 210, 211.

When the contrast 145 is not greater than the threshold (block 920), the example image compression module 150 computes wavelet coefficients for the last image 107 captured for the presently considered tile 210, 211 (block 930). The image compression module 150 quantizes and/or encodes the computed wavelet coefficients (block 935) and stores them in the example image database 155 (block 940). Control then exits from the example process of FIG. 9 to, for example, the example process of FIG. 8 at block 810.

Figure 10:
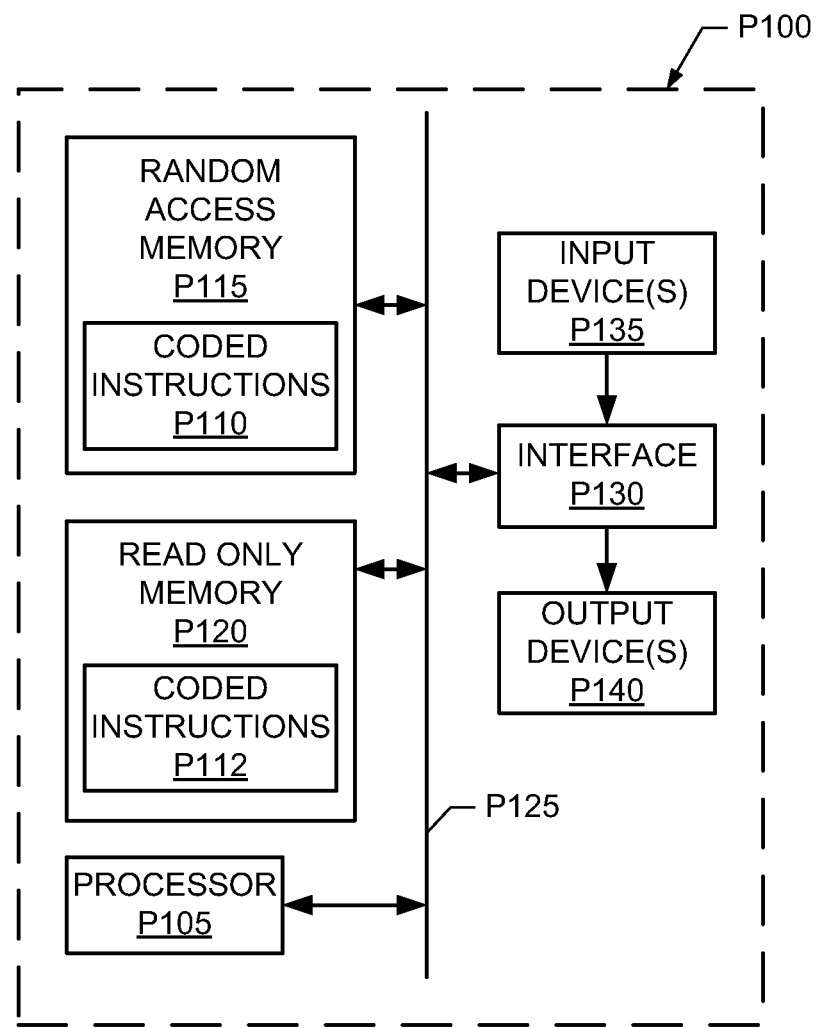
FIG. 10 is a schematic illustration of an example processor platform that may be used and/or programmed to carry out the example process of FIGS. 8 and 9, and/or to implement any or all of the example methods and apparatus described herein.

FIG. 10 is a schematic diagram of an example processor platform P100 that may be used and/or programmed to implement the example adaptive multi-focal plane image acquisition and compression apparatus 100 of FIG. 1. For example, the processor platform P100 can be implemented by one or more general-purpose processors, processor cores, microcontrollers, etc.

The processor platform P100 of the example of FIG. 10 includes at least one general-purpose programmable processor P105. The processor P105 executes coded instructions P110 and/or P112 present in main memory of the processor P105 (e.g., within a RAM P115 and/or a ROM P120). The processor P105 may be any type of processing unit, such as a processor core, a processor and/or a microcontroller. The processor P105 may execute, among other things, the example process of FIGS. 8 and/or 9 to implement the example adaptive multi-focal plane image acquisition and compression methods and apparatus described herein.

The processor P105 is in communication with the main memory (including a ROM P120 and/or the RAM P115) via a bus P125. The RAM P115 may be implemented by dynamic random access memory (DRAM), synchronous dynamic random access memory (SDRAM), and/or any other type of RAM device, and ROM may be implemented by flash memory and/or any other desired type of memory device. Access to the memory P115 and the memory P120 may be controlled by a memory controller (not shown). The example memory P115 may be used to implement the example image database 155 of FIG. 1.

The processor platform P100 also includes an interface circuit P130. The interface circuit P130 may be implemented by any type of interface standard, such as an external memory interface, serial port, general-purpose input/output, etc. One or more input devices P135 and one or more output devices P140 are connected to the interface circuit P130. The input devices P135 may be used to, for example, receive images 107 from the example image acquirer 110. The example output devices P140 may be used to, for example, control the example image acquirer 110 and/or the example focal plane selector 115.

Generally, computer-executable instructions include routines, programs, objects, components, data structures, etc., that perform particular tasks or implement particular abstract data types. Computer-executable instructions, associated data structures, and program modules represent examples of program code for executing the processes to implement the example methods and systems disclosed herein. The particular sequence of such executable instructions and/or associated data structures represent examples of corresponding acts for implementing the examples described herein.

The example methods and apparatus described herein may be practiced in a networked environment using logical connections to one or more remote computers having processors. Logical connections may include a local area network (LAN) and a wide area network (WAN) that are presented here by way of example and not limitation. Such networking environments are commonplace in office-wide or enterprise-wide computer networks, intranets and the Internet and may use a wide variety of different communication protocols. Such network computing environments may encompass many types of computer system configurations, including personal computers, hand-held devices, multi-processor systems, microprocessor-based or programmable consumer electronics, network PCs, minicomputers, mainframe computers, and the like. The example methods and apparatus described herein may, additionally or alternatively, be practiced in distributed computing environments where tasks are performed by local and remote processing devices that are linked (either by hardwired links, wireless links, or by a combination of hardwired or wireless links) through a communications network. In a distributed computing environment, program modules may be located in both local and remote memory storage devices.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method comprising:
capturing a first set of images of an object at a first focal plane and at a first resolution when a comparison indicates that a contrast metric associated with the object is less than or equal to a threshold;
capturing a second set of images of the object at the first focal plane and at a second resolution higher than the first resolution when the comparison indicates that the contrast metric associated with the object is greater than the threshold;
for portions of the object at which the contrast metric caused the first images to be captured at the first resolution, computing first wavelet coefficients of a first frequency;
for portions of the object at which the contrast metric caused the second images to be captured at the second resolution, computing second wavelet coefficients of a second frequency different than the first frequency;
compressing the second wavelet coefficients of the second frequency; and
storing the compressed second wavelets in a representation of the object.

2. A method as defined in claim 1, wherein compressing the second wavelet coefficients comprises compressing a first local group of the second wavelet coefficients into a first data block and a second local group of the second wavelet coefficients into a second data block different than the first data block.

3. A method as defined in claim 2, wherein the first data block is able to be extracted for rendering independently from the second data block.

4. A method as defined in claim 1, wherein the second frequency is greater than the first frequency.

5. A method as defined in claim 1, wherein the threshold is set to identify regions of interest of the object via the comparison involving the contrast metric.

6. A method as defined in claim 1, wherein computing the wavelet coefficients comprises assigning an absolute value to respective ones of the wavelet coefficients that represents a likelihood that a corresponding region of the object is of interest to a user.

7. A method as defined in claim 6, wherein the user is a pathologist and the object is a medical image.

8. An apparatus comprising:
an image acquirer to:
capture a first set of images of an object at a first focal plane and at a first resolution when a comparison indicates that a contrast metric associated with the object is less than or equal to a threshold; and
capture a second set of images of the object at the first focal plane and at a second resolution higher than the first resolution when the comparison indicates that the contrast metric associated with the object is greater than the threshold; and
an image compression module to:
for portions of the object at which the contrast metric caused the first images to be captured at the first resolution, compute first wavelet coefficients of a first frequency;
for portions of the object at which the contrast metric caused the second images to be captured at the second resolution, compute second wavelet coefficients of a second frequency different than the first frequency;
compress the second wavelet coefficients of the second frequency; and
store the compressed second wavelets in a representation of the object.

9. An apparatus as defined in claim 8, wherein compressing the second wavelet coefficients comprises compressing a first local group of the second wavelet coefficients into a first data block and a second local group of the second wavelet coefficients into a second data block different than the first data block.

10. An apparatus as defined in claim 9, wherein the first data block is able to be extracted for rendering independently from the second data block.

11. An apparatus as defined in claim 8, wherein the second frequency is greater than the first frequency.

12. An apparatus as defined in claim 8, wherein the threshold is set to identify regions of interest of the object via the comparison involving the contrast metric.

13. An apparatus as defined in claim 8, wherein computing the wavelet coefficients comprises assigning an absolute value to respective ones of the wavelet coefficients that represents a likelihood that a corresponding region of the object is of interest to a user.

14. An apparatus as defined in claim 13, wherein the user is a pathologist and the object is a medical image.

15. A tangible machine-readable storage device comprising instructions that, when executed, cause a machine to at least:
capture a first set of images of an object at a first focal plane and at a first resolution when a comparison indicates that a contrast metric associated with the object is less than or equal to a threshold;
capture a second set of images of the object at the first focal plane and at a second resolution higher than the first resolution when the comparison indicates that the contrast metric associated with the object is greater than the threshold; and
for portions of the object at which the contrast metric caused the first images to be captured at the first resolution, compute first wavelet coefficients of a first frequency;
for portions of the object at which the contrast metric caused the second images to be captured at the second resolution, compute second wavelet coefficients of a second frequency different than the first frequency;
compress the second wavelet coefficients of the second frequency; and
store the compressed second wavelets in a representation of the object.

16. A storage device as defined in claim 15, wherein compressing the second wavelet coefficients comprises compressing a first local group of the second wavelet coefficients into a first data block and a second local group of the second wavelet coefficients into a second data block different than the first data block.

17. A storage device as defined in claim 16, wherein the first data block is able to be extracted for rendering independently from the second data block.

18. A storage device as defined in claim 15, wherein the second frequency is greater than the first frequency.

19. A storage device as defined in claim 15, wherein the threshold is set to identify regions of interest of the object via the comparison involving the contrast metric.

20. A storage device as defined in claim 15, wherein computing the wavelet coefficients comprises assigning an absolute value to respective ones of the wavelet coefficients that represents a likelihood that a corresponding region of the object is of interest to a user.

* * * * *